United States Patent

[11] 3,630,746

[72] Inventors Yasuyuki Takimoto Takatsuki-shi; Toshikazu Yoshikawa, Amagasaki-shi; Kiyomi Sakurai, Suita-shi; Yasusi Umeda, Osaka; Yoshiaki Oyabu, Kyoto; Takahiro Tsunoda, Funabashi-shi all of Japan

[21] Appl. No. 791,189
[22] Filed Jan. 14, 1969
[45] Patented Dec. 28, 1971
[73] Assignee Nippon Paint Co., Ltd. Osaka, Japan
[32] Priorities Jan. 22, 1968
[33] Japan
[31] 43/3238;
Mar. 15, 1968, Japan, No. 43/16879

[54] PHOTOPOLYMERIZABLE RESIN COMPOSITIONS AND WATER-WASHABLE PHOTOPOLYMER PRINTING PLATES
10 Claims, No Drawings

[52] U.S. Cl. .......... 96/115
[51] Int. Cl. .......... G03c 1/68
[50] Field of Search .......... 96/115; 204/159.16, 159.21

[56] References Cited

UNITED STATES PATENTS

| | | | |
|---|---|---|---|
| 3,366,481 | 1/1968 | Lalone | 96/115 |
| 3,259,499 | 7/1966 | Thommes | 96/115 |
| 3,147,117 | 9/1964 | Wainer et al. | 96/115 |
| 3,357,831 | 12/1967 | Wu | 96/115 |
| 3,148,064 | 9/1964 | Rauner et al. | 96/115 |

*Primary Examiner*—Norman G. Torchin
*Assistant Examiner*—Edward C. Kimlin
*Attorney*—Beveridge & De Grandi

ABSTRACT: A novel photopolymerizable resin composition consists of (1) 1.26 to 3.78 parts by weight of a monoester of a polyhydric aliphatic alcohol with acrylic or methacrylic acid, (2) as a polymeric binder, an aqueous solution of one part by weight of a partially hydrolyzed polyvinyl acetate having a hydrolysis degree of 95 to 60 mol percent and an average polymerization degree of 300 to 2,000 or one part by weight of a methyl cellulose of an average polymerization degree of 160 having a hydroxylpropoxyl substituent and (3) as a photopolymerization initiator, 1 to 5 percent by weight, based on the total weight of the resin components of the above (1) and (2) constituents, of at least one uranyl salt and 0.0072 to 0.72 percent by weight, on the same basis, of azobisisobutyronitrile. A presensitized plate prepared by coating a metal plate with said photopolymerizable resin composition in a thickness of an order of microns is water washable and can be used to form a relief image. Further, a sheet of said photopolymerizable resin composition having a thickness of 0.1 to 3 mm. is directly used in printing and is water washable when it is exposed to actinic light in contact with a screen negative.

PHOTOPOLYMERIZABLE RESIN COMPOSITIONS AND WATER-WASHABLE PHOTOPOLYMER PRINTING PLATES

This invention relates to photopolymerizable resin compositions for making relief images which can be directly used as a printing plate or in making a paper mold and to photopolymerizable resin sheets and photopolymer printing plates, both of which are obtained from the photopolymerizable resin compositions.

Heretofore, relief images for use in printing have been made by the following method:

First, a thin layer of an order of microns is formed by applying on a metal plate a photosensitive composition which contains polyvinyl alcohol and bichromates. Thereafter, the metal plate is exposed to light, washed, and dipped in an etching solution, whereby nonimage areas are engraved and relief images are finally obtained.

The photopolymerizable resin composition of the present invention has such a character that the photopolymerizable resin compositions themselves are photohardenable, and hence, photopolymerizable resin sheets and photopolymer printing plates produced from the photopolymerizable resin compositions can form relief images by an exposure to light followed by washing.

Recently, photopolymer printing plates which can form relief images by themselves and are directly used as printing plates or in making paper molds have come to attract attention and to be used more frequently than before.

As for commercially available photopolymer printing plates, "Dicryl" of E. I. du Pont de Nemours & Co. and nylon printing plates of Time Inc., for instance, are known. In the case of Dicryl, photosensitive polymers are coated on a steel, aluminum and other metal plate. As for photosensitive polymers, such monomers as acrylates or methacrylates, for example, ethylene glycol dimethacrylate, etc., having added thereto a photopolymerization initiator are used. There are used, as the photopolymerization initiators, anthraquinone, benzoin and diacetyl. In order to form a photopolymerizable layer, polyamide, polyvinyl alcohol and the like are used as polymeric binder. After exposure, relief images are formed by washing the said plates with a 0.16 percent aqueous sodium hydroxide solution. The nylon printing plate is composed of alcohol-soluble nylon 808 and N,N'-methylene bisacrylamide as photocross-linking agent. Similarly, relief images can be also formed by washing, after exposure, in an alcoholic solution of calcium chloride and zinc chloride.

These commercially available photopolymer printing plates have, in general, such advantages that various complicated plate-making steps can be simplified, that the images thus obtained can be remarkably sharp and that the weight of the printing materials can be reduced. However, these commercially available photopolymer printing plates have, on the other hand, such disadvantages that the starting resin materials are expensive, that special chemicals are needed for the washing of these plates and that the handling of these plates requires an environment from which ultraviolet rays are excluded, such as yellow safety light.

The photopolymerizable resin compositions of the present invention are specially devised so that a photopolymerizable resin sheet or photopolymer printing plate can be obtained which retains the advantageous printing characteristics of the conventional photopolymer printing plates while being substantially freed from the inconveniences of the conventional products, can be handled under diffused light, can be washed with water and can be used as widely as the metal plates used in the etching process. Therefore, the photopolymerizable resin compositions as well as the photopolymerizable resin sheets or photopolymer printing plates produced therefrom are respectively novel.

More particularly, the photopolymerizable resin sheets and photopolymer printing plates of the present invention comprises a photopolymerizable resin composition consisting of (1) 1.26 to 3.78 parts by weight of a monoester of a polyhydric aliphatic alcohol with acrylic or methacrylic acid, (2) as a polymeric binder, an aqueous solution of one part by weight of a partially hydrolyzed polyvinyl acetate having a hydrolysis degree of 95 to 60 mol percent and an average polymerization degree of 300 to 2,000 or one part by weight of a methyl cellulose having an average polymerization degree of 160 and having a hydroxylpropoxyl substituent and (3) as a photopolymerization initiator, 1 to 5 percent by weight, based on the total weight of the resin components of the above (1) and (2) constituents, of at least one uranyl salt alone or together with 0.0072 to 0.72 percent by weight, on the same basis, of azobisisobutyronitrile. If necessary, hydroquinone may further be added as the polymerization initiator. Therefore, the products of the present invention have such an advantage that they can be washed simply with water after exposure because the resins constituting sheets or plates are themselves water-soluble compositions.

The invention to be disclosed in the present specification covers the following three: (1) photopolymerizable resin compositions, (2) photopolymerizable resin sheets and (3) photopolymer printing plates, which sheets and plates are produced from the above-stated photopolymerizable resin compositions and used for the purpose of making plates for printing.

The relationship among these three modes is as follows:

The photopolymerizable resin composition is subjected as the starting material to press or roll molding to produce the photopolymerizable resin sheets. The remaining photopolymer printing plate is obtained by fixing either the photopolymerizable resin composition or the photopolymerizable resin sheet on a support such as an aluminum or tin plate through an anchor layer. The anchor layer consists of one to three layers and is placed between the support and the photosensitive resin. This anchor layer is necessary to fix the photopolymerizable resin layer on the support plate. The anchor layer for use in this invention includes the following three kinds: (1) a single layer consisting of only a nonhalation layer, (2) a double layer formed by coating an adhesive resin layer on a nonhalation layer or a double layer made by coating a nonhalation layer conversely on an adhesive layer and (3) a triple layer formed by coating a third layer consisting of a photopolymerizable resin composition on the above (2) layer. By this anchor layer, it is aimed to strengthen the adhesiveness, to prevent halation and to control the thickness of the plates. The photopolymerizable resin compositions stated above are used, either as they are or by casting, in a photosensitive resin layer and possess a function of photohardening.

As for acrylic monomers which may be usable in the photopolymerizable resin compositions, a monoester of a polyhydric aliphatic alcohol and acrylic or methacrylic acid, such as β-oxyethyl acrylate, β-oxyethyl methacrylate, β-oxypropyl acrylate or β-oxypropyl methacrylate can be used. In working the present invention, these acrylates or methacrylates are used alone or in admixture. Further, if necessary, monofunctional acrylamide derivatives such as acrylamide, methacrylamide, N-methylacrylamide and N-methylmethacrylamide can be used together with said acrylate or methacrylate. An addition of these jointly used compounds is useful for improving the water washability of the products. An advantage of using acrylates or methacrylates having free hydroxyl groups exists in that photohardening is made possible by use of a relatively low amount of energy, for instance, 1.9 kcal./mol when β-oxyethyl methacrylate is used, because the activation energy required for the photopolymerization reaction is low.

As for water-soluble high polymers, polyvinyl alcohol, methyl cellulose and gelatin can be used. Of these high polymers, polyvinyl alcohols are preferable in view of the easiness in coating and molding processes. As for the polyvinyl alcohol, polyvinyl acetates having a hydrolysis degree within the range of 60 to 95 mol percent and an average polymerization degree of 300 to 2,000 can be used. It is more preferable to use a polyvinyl acetate having a hydrolysis degree of 88 mol percent or 82 mol percent with an average polymerization degree of 300 to 1,000. These partially hydrolyzed polyvinyl acetates as stated above are more advantageous than those with a higher hydrolysis degree, because the former have an appropriate degree of fluidity and an excellent compatibility with acrylates or methacrylates and because foams which are formed in the mixing and dissolving steps can be spontaneously removed and because acrylates or methacrylates can be grafted at the side chain acetyl radicals. The ratio of the resin content of the polymeric binder to the acrylates is one part by weight of polymeric binder to 1.26 to 3.78 parts by weight of acrylates or methacrylates. This ratio can be altered according to purposes.

As for the photoinitiator, at least one uranyl salt having its main absorption spectra in the range of from ultraviolet to visible light is used together with azobisisobutyronitrile. As for the uranyl salts, compounds represented by the general formula, $UO_2 \cdot X_2$, wherein X is an acid residue of monovalency, can be used, such as uranyl nitrate, uranyl acetate, uranyl sulfate, uranyl phosphate and uranyl diburyl phosphate. The use of azobisisobutyronitrile is extremely advantageous when the exposure time must be shortened or when the light source is weak, because the chain-transfer coefficient of this compound is zero and the compound does not cause inductive decomposition though it possesses photosensitizability of polymerization. The amount of catalysts used can conveniently be altered according to purposes of use. It is necessary, however, to add 1 to 5 percent by weight of a uranyl salt and 0.0072 to 0.72 percent by weight of azobisisobutyronitrile, both based on the total amount of the resin contents of polymeric binder and acrylate.

When an amount of a uranyl salt exceeding the upper limit of the said range is used, the engraving rate of the nonexposed area after exposure is lowered. Conversely, when an amount of a uranyl salt below the lower limit of said range is used, the photohardening rate of the exposed area becomes so low that the product does not suit for the general plate-making purposes.

As for the amount of azobisisobutyronitrile used, when the said amount exceeds the upper limit of the previously stated range, an engraving becomes difficult because the overall surface is, although slightly, hardened owing to a dark reaction, whereby the difference in water solubility between the exposed area and the nonexposed area becomes little. Conversely, when the amount used does not reach the lower limit of the above-mentioned range, any addition effect is not expected.

Acrylates are photopolymerized by irradiation with ultraviolet rays or visible light in the presence of a photopolymerization initiator to form polymers. In the present invention, however, uranyl salts and azabisisobutyronitrile which are little sensitive to visible light are used as the photopolymerization initiator without using photosensitive coloring matters, and therefore, safety light is not required in handling the present composition. This is one of the advantages of the present invention. Photosensitive coloring matters may also be used together with said photopolymerization initiator in the present invention, though are generally not necessary except when the present composition is used for a special purpose, such as for widening the exposure latitude.

The production of the photopolymerizable resin compositions form the above-mentioned constituents and the production of the photopolymerizable resin sheets or photopolymer printing plates from the photopolymerizable resin compositions are conducted as follows:

The photopolymerizable resin composition can be produced as either (1) a diluted resin composition or (2) a concentrated resin composition. The (1) diluted resin composition can be prepared by mixing the constituents at room temperature using a mixer, but the (2) concentrated resin composition must be prepared by effecting the mixing at a temperature of 50°–60° C. using a vacuum kneader. Some embodiments of the production of the diluted resin composition are illustrated in method 1 and method 2 below. Further, some embodiments of the production of the concentrated resin composition are illustrated likewise in method 3 and method 4 below.

METHOD 1

| | |
|---|---|
| Partially hydrolyzed polyvinyl acetate (33.6 % aqueous solution) (Hydrolysis degree: 82 mol %, average polymerization degree: 500) | 255.3 parts by weight |
| β-Oxyethyl methacrylate | 213.2 parts by weight |
| Uranyl nitrate | 14.9 parts by weight |

The above three constituents are thoroughly mixed and dissolved with a mixer. After the mixing is completed, the resulting mixture is subjected to defoaming for 20 min. under a reduced pressure of 30 mm. Hg. Subsequently, the mixture is deoxygenated for 30 min. under a reduced pressure of 2 mm. Hg, whereby a diluted, photopolymerizable resin composition is produced. The treatments under reduced pressure illustrated above are both conducted at a temperature of 20° C.

METHOD 2

| | |
|---|---|
| Partially hydrolyzed polyvinyl acetate (33.6 % aqueous solution) (Hydrolysis degree: 88 mol %, average polymerization degree: 500) | 255.3 parts by weight |
| β-Oxyethyl methacrylate | 213.2 parts by weight |
| Uranyl nitrate | 14.2 parts by weight |

The above three constituents are thoroughly mixed and dissolved by means of a mixer. Thereafter, the resulting mixture is treated in the same manner as in method 1 to obtain a diluted, photopolymerizable resin composition is obtained.

METHOD 3

| | |
|---|---|
| Partially hydrolyzed polyvinyl acetate (55 % aqueous solution) (Hydrolysis degree: 82 mol %, average polymerization degree: 500) | 255.3 parts by weight |
| β-Oxyethyl methacrylate | 317.0 parts by weight |
| Uranyl nitrate | 22.8 parts by weight |

A vacuum kneader is used for mixing and dissolving the three constituents. That is, a mixed solution of the above-hydrolyzed β-oxyethyl methacrylate and uranyl nitrate is added dropwise to the aqueous solution of partially hydrolyzed polyvinyl acetate in the vacuum kneader over a period of 40 min. and these components are mixed therein. During mixing, nitrogen gas is introduced so that the mixing is conducted under a nitrogen gas atmosphere. The temperature for the mixing is held at 60° C. After the mixing is completed, the mixture is subjected to defoaming under a reduced pressure, whereby a concentrated photopolymerizable resin composition is obtained.

METHOD 4

| | |
|---|---|
| Partially hydrolyzed polyvinyl acetate (55 % aqueous solution) (Hydrolysis degree: 88 mol %, average polymerization degree: 500) | 253.0 parts by weight |
| β-Oxyethyl methacrylate | 317.0 parts by weight |
| Uranyl nitrate | 22.8 parts by weight |

A concentrated, photopolymerizable resin composition is obtained by effecting the treatment in the same manner as in method 3.

The diluted resin compositions are formed into photopolymer printing plates or photopolymerizable resin sheets as follows:

First, the diluted resin composition is applied onto a support or cast on a fluorocarbon resin plate in such a way that the thickness of the resin composition is 0.1 to 2 mm. in both cases. Thereafter, the assembly is dried at a temperature of 60° C. under either normal or a reduced pressure. Care should be taken so that a reduction in weight due to drying is equal to the theoretical water weight of the resin composition in either case. The support having the resin composition applied thereto can, as such, be used as a photopolymer printing plate. On the other hand, the cast product is separated from the fluorocarbon resin plate to form a photopolymerizable resin sheet. This sheet can be used as it is or also can be turned to a photopolymer printing plate by fixing it on a support.

The concentrated resin composition, on the other hand, if formed into a photopolymer printing plate by either of the following two alternative methods:

1. The concentrated resin composition is first injected through a slit at a temperature within a range of 50° to 60° C., and thereafter passed through a calender roll.

2. The concentrated resin composition is first cast on a flat table at a temperature of 50° to 60° C. in such a manner that the thickness is adjusted to the specified thickness, and thereafter, another flat table is placed on the top of the cast resin and the pair of the flat tables are clamped by bolts, whereby the sandwiched resin is press-molded. The time necessary for the pressing is 30 to 60 min. After pressing, a photopolymerizable resin sheet is produced by releasing the pressed resin.

By a still further method, a photopolymer printing plate can directly be obtained from the concentrated resin composition by casting it on a support having an anchor layer in the same pressing method as stated above.

The anchor layer is needed for the following reasons:

In the resin composition of the present invention, the acrylate or methacrylate which is the photopolymerizable component tends to be leached with the lapse of time, and hence, the composition cannot be adhered by any known adhering method. Even if said resin composition is actually adhered, it has a defect that the adhesion strength is lowered with the lapse of time, and finally, the adhered part is peeled off. Therefore, a special method must be developed in order to provide an adhesion strength that can endure the printing processings.

The anchor layer contains as one of its components such a high polymer having an ability to solubilize the acrylate or methacrylate contained therein as, for instance, an aqueous solution of the same partially hydrolyzed polyvinyl acetate as that constituting a photopolymerizable resin sheet or an aqueous solution of methyl cellulose having a hydroxylpropoxyl substituent.

A photopolymer printing plate can be produced from a photopolymerizable resin sheet by the following method:

First, a suspension liquid is prepared by dispersing pigments effective for nonhalation in the same kind of water-soluble high polymer as used for a photopolymerizable resin sheet as a polymeric binder. Thereafter, the thus-obtained suspension is uniformly applied onto a support, whereby a nonhalation layer is formed.

The subsequent processes are different, depending on the final products to be aimed.

1. In the case of the diluted photopolymerizable resin composition, a photopolymer printing plate can be produced by the following process:

An aqueous solution of the same water-soluble high polymer as stated above is applied as an adhesive layer to a desired thickness. Thereafter, a photopolymerizable resin sheet is closely attached onto the support. Subsequently, the resultant is passed through a calender roll, whereby the adhesion of the above-stated part is secured and at the same time thickness of the photopolymer printing plate is controlled. In this calendering process, if the thickness of the adhesive layer is 0.05 to 0.1 mm., the thickness of the final product can be made uniform even if the thickness of the photopolymerizable resin sheet itself more or less fluctuates. After calendering, the adhered plate is dried to obtain a photopolymer printing plate. A deviation of the thickness can be held in this process within ±0.02 mm. from the average value.

A simplified method for producing a photopolymer printing plate is available, in which a suspension containing the same pigments as specified above is applied on a support. Thereafter, a diluted resin composition is cast on the above-stated support. Subsequently, the cast product is dried, and thereby, a photopolymer printing plate is obtained. By sanding the thus obtained printing plate with a belt sander or a drum sander, it is possible to produce a photopolymer printing plate having a high accuracy in thickness.

This simplified method is economical because an adhesion process can be eliminated.

2. In the case of the concentrated photopolymerizable resin composition, a photopolymer printing plate can be produced by the following process:

First, an anchor layer is formed on a support. Thereafter, the said resin composition is poured over this anchor layer and the resultant is pressed in between two flat tables, whereby a photopolymer printing plate is obtained.

More particularly, the said anchor layer is formed by either of the following two methods:

a. A mixture of an aqueous solution of a partially hydrolyzed polyvinyl acetate (hydrolysis degree: 82 mol percent; average polymerization degree: 500), $\beta$-oxyethl-methacrylate and azobisisobutyronitrile is applied to a nonhalation layer. Thereafter, the resultant is cured first at 60° C. and subsequently at 120° C. to obtain an anchor layer with a thickness of 0.3 mm.

b. Pigments having a nonhalation ability are added to and dispersed in the mixture described in (a) to obtain a suspension. The thus-obtained suspension is applied on a support and the resultant is cured to form an anchor layer.

Over the anchor layer obtained by either of these methods, a concentrated photopolymerizable resin composition is poured. Thereafter, the resultant is pressed by a press flame space-adjusted so that the desired thickness may be obtained. The thus-pressed resin is then released from the press flame and the resin is thereafter either dried or calendered and dried, whereby a photopolymerizable printing plate is obtained. A deviation in thickness can be limited within ±0.02 mm. from the average value, irrespective of the pressing method employed.

As for pigments having nonhalation effect, red iron oxide pigment, carbon black, chrome green and the like may be used. It is preferable, however, to use red iron oxide pigment in view of the stability of the suspension obtained and of the coating performance. The use of this iron oxide pigment is economical also because it is less expensive than other pigments and dyes which are generally used for the prevention of halation.

From the thus-obtained photopolymerizable resin sheets or photopolymer printing plates, relief images are formed as follows:

First, a negative of the original is contacted with the photopolymerizable resin sheet or photopolymer printing plate. Then, in the case of the photopolymerizable resin sheet, the sheet is exposed to light from both surfaces; and in the case of the photopolymer printing plate, the plate is exposed to light only through the negative. Thereafter, water is sprayed at a water pressure of 1 to 3 kg./cm.$^2$ over the sheet or plate, whereby the nonexposed area is washed off and a positive relief image is obtained. The exposure time can be further shortened, and the fidelity of reproducing the original lines and the sharpness of the picture can be improved if the plate or sheet is allowed to stand in a nitrogen or carbon dioxide atmosphere prior to the exposure.

The relief image thus obtained can reproduce a minimum line of 40 microns. As for the light source to be used, any of the following lamps can be used: a high-pressure mercury vapor lamp, a carbon arc lamp, a xenon lamp and a tungsten lamp. A photopolymerizable resin sheet can be used as a printing plate by attaching it to a saddle after the exposure-washing-drying treatments.

Table 1 shows the various plate-making conditions used and the results obtained in tests. The test numbers in table 1 coincide with those of the examples which will appear later herein. In table 1, it can be said that the sheet or plates which need a shorter exposure and washout time have so much better workability. It can also be said that in view of the plate-making results, the smaller the figure showing a reproducible minimum line, the better the product.

TABLE 2.—COMPARISON OF VARIOUS PRINTING PLATES

| Plate | Plate-making time (min.) | Processing | Minimum line (micron) | Price |
|---|---|---|---|---|
| Metal plates* | 20-30 | Exposure-washing (water)-burning-etching-drying. | 60-40 | Low. |
| Dicryl | 15 | Exposure-washing (alkaline)-drying. | 40 | Very high. |
| Nylon plate | 15 | Exposure-washing (alcohol)-drying. | 40 | High. |
| Photopolymer printing plate of this invention. | 8 | Exposure-washing (water)-drying. | 40 | Low. |

*As plate material, a zinc plate or a magnesium plate was used, to which plate a photosensitive composition containing a polyvinyl alcohol and a bichromate was applied.

TABLE 1.—CONDITIONS AND RESULTS OF PLATE-MAKING PROCESS

| Plate form | | Plate-making conditions: Conditioning time in carbon dioxide atmosphere (min.) | Exposure: Time (sec.) | Exposure: Lux | Washout time (sec.) | Plate-making results: Minimum line in relief image (microns) |
|---|---|---|---|---|---|---|
| Test 1: | | | | | | |
| 1 | Photopolymer printing plate | 150 | 45 | 200,000 | 150 | 40 |
| 2 | do | 150 | 45 | 200,000 | 130 | 40 |
| 3 | do | 150 | 45 | 200,000 | 150 | 40 |
| 4 | do | 150 | 90 | 200,000 | 150 | 40 |
| 5 | do | 150 | 90 | 200,000 | 150 | 60 |
| 6 | do | 150 | 90 | 200,000 | 150 | 60 |
| 7 | do | 150 | 90 | 200,000 | 150 | 60 |
| 8 | do | 150 | 90 | 200,000 | 150 | 60 |
| 9 | do | 150 | 60 | 200,000 | 150 | 40 |
| Test 2 | Photopolymerizable resin sheet | 1,200 | 80 | 80,000 | 150 | 60 |
| | Photopolymer printing plate | 1,200 | 47 | 200,000 | 150 | 40 |
| Test 3 | Photopolymer printing plate | 1,200 | 60 | 200,000 | 150 | 40 |
| Test 4 | do | 1,200 | 60 | 200,000 | 150 | 40 |
| Test 5 | Photopolymerizable resin sheet | 1,200 | 80 | 80,000 | 150 | 60 |
| | Photopolymer printing plate | 1,200 | 60 | 200,000 | 150 | 40 |
| Test 6 | Photopolymerizable resin sheet | 1,200 | 80 | 80,000 | 150 | 60 |
| Test 7 | do | 1,200 | 80 | 80,000 | 150 | 60 |
| Test 8 | Photopolymer printing plate | 1,200 | 50 | 200,000 | 150 | 40 |
| Test 9 | do | 1,200 | 50 | 200,000 | 150 | 40 |

Note:

1. Plate-making conditions:

*Conditioning:* Test sheets or plates were subjected to conditioning for a desired period of time in a conditioning box under a carbon dioxide gas atmosphere and thereafter exposed to light from a carbon arc lamp.

*Exposure:*

1. a photopolymer printing plate was exposed to light for a desired period of time in contact with a line or screen negative in a vacuum printer.
2. both surfaces of a photopolymerizable resin sheet were exposed to light for a desired period of time, while one of the surfaces was in contact with a line or screen negative. The exposure is made simultaneously from both surfaces of the sheet using a pair of carbon arc lamps of the same intensity of illumination.

*Washout:* A relief image was obtained by spraying water at a water pressure of 1–3 kg./cm.$^2$ to wash the nonexposed area off.

2. Plate-making results: A test chart which had in total, 15 lines having widths of 10, 20, 30... and 150 microns drawn at a uniform space was used to determine how fine line could be reproduced as relief image.

Table 2 shows a comparison of a photopolymer printing plate with "Dicryl," a nylon printing plate and a metal plate. A photopolymerizable resin sheet is excluded from this comparison because a step of adhering the sheet to a saddle is required and hence, comparison from the same view point is impossible. It was, however, confirmed that a photopolymerizable resin sheet was equivalent in plate-making ability to a photopolymer printing plate.

The following are clearly seen from table 2:

1. As for the time required for plate making, the photopolymer printing plate of this invention needs only about 8 minutes, whereas "Dicryl" and a nylon printing plate need about 15 minutes and a metal printing plate requires from 20 to 30 minutes.

2. Both the photopolymerizable resin sheet and photopolymer printing plate of this invention can be washed with water, while Dicryl and nylon printing plates cannot be washed with water.

3. Compared with metal printing plates, the products of this invention are about equal in price, but this invention has enabled the processing steps to be simplified, the processing time to be shortened, an acidic etching liquid to be replaced by water as a developer, and the materials used for plate making to be lightened. In these respects, the present invention is superior to various, commercially available printing plates.

From tables 1 and 2, it can be safely concluded that both the photopolymerizable resin sheets and photopolymer printing plates of this invention are lower in price than, and at the same time, possess properties and performance comparable to, Dicryl or nylon printing plates which are now accepted to demonstrate the most excellent performance as printing plates. These unexpected advantages of the products of this invention will certainly be welcomed widely by the general printing-plate processors and printers.

The photopolymerizable resin composition of this invention is highly stable and can be stored over a year at a dark place. Also, both the photopolymerizable resin sheets and photopolymer printing plates which are both produced from the above-stated photopolymerizable resin composition can be stored for several months at a dark place. Furthermore, said photopolymerizable resin sheets and photopolymer printing plates do not show any dark reaction even when they are left for a period over 10 hours under conditions of 45° C. in temperature and 90 percent in relative humidity. Therefore, the said photopolymerizable resin compositions can be not only used directly as printing plates, but also be used in a similar manner to a conventional photosensitive composition of a polyvinyl alcohol and a bichromate. That is, the said photopolymerizable resin compositions can be used in the following manner, wherein a thin layer of an order of microns is formed by coating the said resin compositions on a metal plate and the coated metal plate (so-called "presensitized plate") is then exposed to ultraviolet rays and washed out with water, whereby line images are obtained. More particularly, the said photopolymerizable resin compositions can be used in making silk screens and printed-circuit diagrams and as a binder for color television phosphors.

EXAMPLE 1

Photohardened relief images were obtained form photopolymer printing plates which were produced using the photopolymerizable resin compositions shown in table 3.

1. A method for producing photopolymerizable resin compositions: A set of the polymeric binder, acrylate or methacrylate and photopolymerization initiator listed in table 3 was thoroughly mixed and dissolved with a mixer. The resulting mixture was mixing, subjected to defoaming for 20 minutes under a reduced pressure of 30 mm. Hg. Subsequently, the resultant was deoxygenated for 30 minutes under a reduced pressure of 2 mm. Hg, whereby diluted photopolymerizable composition was obtained. The above treatments conducted under a reduced pressure were carried out at a temperature of 20° C.

2. Methods for producing a photopolymer printing plate: A photopolymer printing plate was obtained by the following two methods: (a) the photopolymerizable resin composition was cast on a flat fluorocarbon resin plate and thereafter dried, or (b) the said resin composition was cast on a flat fluorocarbon resin plate and thereafter dried. In either method, the extent of the reduction of weight by drying was limited to 36 percent by weight of the weight of the composition, which percentage was equal to the theoretical weight of water contained. A photopolymer printing plate was obtained in the case of (a) without further processing and in the case of (b) by releasing the said cast resin from the fluorocarbon resin plate and thereafter attaching the released resin to an aluminum plate.

3. A method for producing a relief image from a photopolymer printing plate: A line negative or a screen negative was contacted with a photopolymer printing plate in a vacuum printing frame with or without allowing it to stand in a nitrogen or carbon dioxide atmosphere. Them, the said printing plate was exposed to light from a carbon arc lamp which could provide a surface illumination strength of 200,000 lux, and washed according to the various conditions shown in table 1, whereby a light yellow photohardened relief image was obtained.

EXAMPLE 2

A Photopolymerizable Resin Sheet

The photopolymerizable resin composition specified in the aforesaid method 1 was cast in a thickness of 2 mm. on a flat silicone resin plate. The cast product was dried until the reduced weight amounted to 36 percent of the weight of the said cast photopolymerizable resin composition, which percentage corresponded to the theoretical weight of water contained in the cast composition. After cooling, the cast product was released from the silicone resin plate, whereby a photopolymerizable resin sheet with a thickness of 1.5±0.15 mm. was obtained.

Table 3.—Components of Photopolymerizable Resin Composition

| No. | Polymeric binder: Kind [1] | Polymeric binder: Quantity used (parts) | Acrylates 1: Kind | Acrylates 1: Quantity used (parts) | Acrylates 2: Kind | Acrylates 2: Quantity used (parts) | Photopolymerization initiator 1: Kind | Photopolymerization initiator 1: Quantity used (parts) | Photopolymerization initiator 2: Kind | Photopolymerization initiator 2: Quantity used (parts) |
|---|---|---|---|---|---|---|---|---|---|---|
| 1 [2] | PVA ($\bar{P}$=500, S=82 mol percent), 33.6% aqueous solution. | 255.3 | β-Oxyethyl methacrylate | 213.2 | | | Uranylnitrate | 14.9 | | |
| 2 | PVA ($\bar{P}$=500, S=88 mol percent), 33.6% aqueous solution. | 255.3 | do | 213.2 | Acrylamide | 5.9 | do | 14.9 | | |
| 3 | PVA ($\bar{P}$=500, S=82 mol percent), 33.6% aqueous solution. | 255.3 | β-Oxypropyl methacrylate | 236.5 | | | do | 16.0 | | |
| 4 | do | 255.3 | β-Oxyethyl acrylate | 190.2 | | | do | 13.8 | | |
| 5 | do | 255.3 | β-Oxyethyl methacrylate | 213.2 | | | do | 5.9 | | |
| 6 | do | 255.3 | β-Oxyproply methacrylate | 236.5 | | | do | 6.5 | | |
| 7 | Methylcellulose ($\bar{P}$=160), 30% aqueous solution | 255.3 | β-Oxyethyl methacrylate | 190.0 | | | do | 5.2 | | |
| 8 | PVA ($\bar{P}$=500, S=82 mol percent), 33.6% aqueous solution. | 255.3 | do | 213.2 | | | do | 8.0 | Azobisiso butyronitrile | 6.0 |
| 9 | do | 255.3 | do | 213.2 | | | do | 10.0 | Uranylsulphate | 6.0 |

[1] PVA=partially hydrolyzed polyvinyl acetate, $\bar{P}$=average polymerization degree and S=hydrolysis degree.
[2] Photopolymerizable resin compositions are the same as produced by the aforesaid Method 1.

A Photopolymer Printing Plate a. Production of an anchor layer:

A suspension having the composition shown below was spray-coated on an aluminum support having a thickness of 1 mm. The thickness of the coating was adjusted to 0.1 mm.

The composition of the suspension:

| | | |
|---|---|---|
| (1) | 15% aqueous solution of the polymeric binder used in aforesaid Method 1 | 205 parts by weight |
| (2) | red iron oxide pigment | 20 parts by weight |

(viscosity: 700 centipoises at 25° C.)

On the thus-obtained support coated with the suspension, a 33 percent aqueous solution of the polymeric binder used in method 1 was uniformly coated so that the thickness of the layer of the polymeric binder became 0.1 mm. The coating was applied either by spray coating or roller coating.

b. Adhesion of the anchor layer to photopolymerizable resin sheet:

On the anchor layer obtained in (a), a photopolymerizable resin sheet was placed and the assembly was passed through a calender roll, the gap of which roll was preadjusted as desired, whereby the adhesion and regulation of the thickness were achieved at the same time. By these operation, a photopolymer printing plate having a deviation of ±0.02 mm. in thickness was obtained.

EXAMPLE 3

A Photopolymer Printing Plate:

a. Production of an anchor layer:

On the support coated with the suspension described in (a) of example 2, a 20 percent aqueous solution of a methyl cellulose (methoxyl substitution degree=1.68, hydroxyl-propoxyl substitution degree=0.17) was coated in a thickness of 0.1 mm.

b. Adhering the anchor layer to photopolymerizable resin sheet:

By treating in the same way as stated in example 2, a photopolymer printing plate having a deviation of 0.02 mm. in thickness was obtained.

EXAMPLE 4

A Photopolymer Printing Plate

The photopolymerizable resin composition stated in method 1 was cast on the same metal support as stated in (a) of example 2 in a thickness of 2 mm. After drying, the surface of the cast product was sanded with a belt sander, whereby a photopolymer printing plate with a thickness of 1.5±0.025 mm. was obtained.

EXAMPLE 5

A Photopolymerizable Resin Sheet

The photopolymerizable resin composition shown in method 1 was cast in a thickness of 2 mm. on a chromium-plated plate. After casting, a polyvinyl alcohol film which is soluble in warm water was contacted with the cast product, and thereafter a flat metal plate was placed on the film-contacted cast product in order to provide flatness. After this treatment was finished, the resultant was dried, and cooled, and the cast product was released to obtain a photopolymerizable resin sheet with a thickness of 1.5±0.02 mm.

A Photopolymer Printing Plate

A photopolymer printing plate with a deviation of ±0.02 mm. in thickness was obtained by treating the obtained photopolymerizable resin sheet in the same manner as (a) and (b) of example 2.

EXAMPLE 6

*A Photopolymerizable Resin Sheet*

A pair of flat iron plates which could be set to a gap of 2 mm. were prepared. One of the flat iron plates was placed on a horizontal plane. On this plate, a hard polyvinyl chloride resin plate was placed. On the polyvinyl chloride resin plate, the photopolymerizable resin composition shown in method 3 was poured at a temperature of 60° C. Another flat iron plate was placed on the poured resin composition. The pair of the flat iron plates were then pressed with bolts to the set thickness. After allowing to stand for 2 hours, the pressed assembly was released and dried for 30 minutes at 60° C., whereby a photopolymerizable resin sheet was obtained.

By effecting the same treatments as described above, a photopolymerizable resin sheet was also produced from the photopolymerizable resin composition shown in method 4.

EXAMPLE 7

A Photopolymerizable Resin Sheet

A double-roll equipment equipped with a resin injection slit was adjusted in advance to a gap of 5 mm. Between the rolls a hard polyvinyl chloride resin plate of a thickness of 2 mm. was inserted as a guide plate. On the said guide plate, a photopolymerizable resin composition of method 3 maintained at 60° C. was injected through the said injection slit, then passed through between the rolls and dried for 30 minutes at a temperature of 60° C., to obtain a photopolymerizable resin sheet.

Similarly, a photopolymerizable resin sheet was produced from the photopolymerizable resin composition shown in method 4.

EXAMPLE 8

A Photopolymer Printing Plate

The photopolymerizable resin composition shown in method 1 was cast in a thickness of 2 mm. on a chromium-plated plate. After drying, the cast product was released from the plate, whereby a photopolymerizable resin sheet was obtained. One of the surfaces of the thus-obtained resin sheet was sanded with a belt sander. The thus-sanded resin sheet with a thickness of 1.5±0.025 mm. was then fixed on a support by means of the following anchor layer.

Anchor Layer:

On the 100-micron layer shown in (a) of example 2, a 30 percent aqueous solution of partially hydrolyzed polyvinyl acetate (hydrolysis degree=82 mol percent, average polymerization degree=500) was coated and the thus obtained anchor layer was used in the wet state.

The photopolymerizable resin sheet was placed on the said anchor layer, and thereafter the said sheet and the anchor layer including the support were passed through the said double roll preadjusted to a desired gap, whereby the production of the plate and the regulation of the plate thickness were simultaneously achieved.

By this process, a photopolymer printing plate having a deviation of ±0.02 mm. in thickness (the thickness of the resin layer was 1.5 mm.) was obtained.

EXAMPLE 9

A Photopolymer Printing Plate:

The photopolymerizable resin compositions shown in methods 3 and 4 were adhered by pressing to an aluminum support through one of the anchor layers specified below, to obtain a photopolymer printing plate. In this process, the flat plates shown in example 6 were used.

Anchor Layers

1. A double layer consisting of the following first and second layers;: As the first layer, the 100-micron-thick layer containing red iron oxide pigments mentioned in example 2, (a), was used. On this first layer, a resin composition obtained by mixing 100 parts by weight of $\beta$-oxyethyl methacrylate, 132 parts by weight of a 30 percent aqueous solution of partially hydrolyzed polyvinyl acetate (hydrolysis degree=82 mol percent, average polymerization degree=500) and one part by weight of azobisisobutyronitrile was coated as the second layer. Thereafter, the product was cured first for 30 minutes at a temperature of 69° C. and subsequently for 40 minutes at a temperature of 120° C., whereby a double layer was obtained.

2. A triple layer consisting of the following three layers: On the anchor layer shown in the above (1), the third layer of a resin composition obtained by mixing 7.0 parts by weight of uranyl nitrate with the resin composition used as the second layer in the above (1) was coated in a thickness of 50 microns in a wet state. The thus-obtained triple anchor layer was used in a wet state.

3. A double layer obtained by reversing the first layer (nonhalation layer) and the second layer, (resin layer) of the double anchor layer stated in the above (1).

4. A triple layer obtained by coating in a thickness of 50 microns the third layer of resin composition shown in the above (2) in a wet state on the anchor layer shown in the above (3). The thus-obtained anchor layer was used in a wet state.

EXAMPLE 10

Letterpress printing images were obtained by the following process using a diluted resin composition which was obtained by adding 100 parts by weight of the photopolymerizable resin composition stated in method 1 or method 2 to 100 parts by weight of water.

The said diluted resin composition was uniformly coated on a zinc plate of a thickness of 0.1 mm. with a whirler and then dried. Thereafter, a line negative or a screen negative was contacted with the thus-coated zinc plate in a vacuum printing frame. Subsequently, the negative-contacted plate was exposed for 5 minutes to a chemical lamp which had a surface illumination strength of 1,200 lux and washed with water, whereby a relief image was obtained. The thus-obtained image plate was dipped in a 5 percent aqueous solution of chromic acid for 30 minutes at room temperature for hardening the relief image. The thus-hardened image plate was then subjected to burning at a temperature of 120° C. for a period of 5 to 10 minutes, whereby an acid resist was obtained. Thereafter, according to the ordinary method, the image plate was rubbed with a 10 sulfuric acid solution and then etched with the Dow etching method, whereby a letterpress printing image was obtained.

What is claimed is:

1. A water-soluble photopolymerizable resin composition consisting essentially of (1) 1.26–3.78 parts by weight of a monoester of a polyhydric aliphatic alcohol with acrylic acid or methacrylic acid, (2) as a polymeric binder, an aqueous solution of one part by weight of a partially hydrolyzed polyvinyl acetate having a hydrolysis degree of 95–60 mol percent and an average polymerization degree of 300–2,000 or one part by weight of a methyl cellulose of an average polymerization degree of 160 having a hydroxylpropoxyl substituent and (3) as a photopolymerization initiator, 1–5 percent by weight, based on the total weight of the resin components of the above (1) and (2) constituents, of at least one uranyl salt alone or together with 0.0072–0.72 percent or the same basis, of azobisisobutyronitrile.

2. A photopolymerizable resin composition containing further as the (1) constituent of claim 1, 1–10 percent by weight, based on the weight of the above-stated acrylate or methacrylate, of a monofunctional acid amide derivative of acrylic or methacrylic acid.

3. A water-developable presensitized plate consisting essentially of a metal plate having coated thereon a film of an order of microns of the photopolymerizable resin composition as claimed in claim 1.

4. A material for a printing plate consisting essentially of a sheet of a thickness of 0.1–3 mm. of the photopolymerizable resin composition as claimed in claim 1.

5. A water-washable photopolymer printing plate having coated thereon a sheet of a thickness of 0.1–3 mm. of the photopolymerizable resin composition as claimed in claim 1.

6. A water-washable photopolymer printing plate consisting essentially of a sheet of a thickness of 0.1–3 mm. of the photopolymerizable resin composition as claimed in claim 1, a metal plate and an anchor layer inserted between the said resin composition and the said metal plate.

7. A photopolymer printing plate as claimed in claim 6, wherein the said anchor layer consists essentially of a single layer of a partially hydrolyzed polyvinyl acetate containing pigments having a nonhalation ability.

8. A photopolymer printing plate as claimed in claim 6, wherein the said anchor layer consists essentially of (1) a nonhalation layer and (2) a baked resin layer of a mixture of 29.6 parts by weight of a partially hydrolyzed polyvinyl acetate, 100 parts by weight of $\beta$-oxyethyl methacrylate and 1 part by weight of azobisisobutyronitrile.

9. A photopolymer printing plate as claimed in claim 6, wherein the said anchor layer consists of essentially (1) a nonhalation layer, (2) a baked resin layer of a mixture of 29.6 parts by weight of a partially hydrolyzed polyvinyl acetate, 100 parts by weight of $\beta$-oxyethyl methacrylate and one part by weight of azobisisobutyronitrile and (3) a layer of a mixture of seven parts by weight of uranyl nitrate, 29.6 parts by weight of a partially hydrolyzed polyvinyl acetate, 100 parts by weight of $\beta$-oxyethyl methacrylate and one part by weight of azobisisobutyronitrile, the said (3) layer being contacted with the photopolymerizable resin layer.

10. A photopolymerizable resin sheet formed of the composition defined in claim 1.

* * * * *